United States Patent
Sato et al.

(10) Patent No.: US 9,775,266 B2
(45) Date of Patent: *Sep. 26, 2017

(54) MODULAR UNINTERRUPTIBLE POWER SUPPLY APPARATUS

(71) Applicant: Toshiba Mitsubishi-Electric Industrial Systems Corporation, Chuo-ku (JP)

(72) Inventors: Eduardo Kazuhide Sato, Tokyo (JP); Masahiro Kinoshita, Tokyo (JP); Yushin Yamamoto, Tokyo (JP); Tatsuaki Amboh, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/365,405

(22) Filed: Nov. 30, 2016

(65) Prior Publication Data

US 2017/0086329 A1  Mar. 23, 2017

Related U.S. Application Data

(63) Continuation of application No. 13/202,478, filed as application No. PCT/JP2009/055306 on Mar. 18, 2009, now Pat. No. 9,548,630.

(51) Int. Cl.
*H02J 9/06* (2006.01)
*H05K 7/20* (2006.01)
(Continued)

(52) U.S. Cl.
CPC ............. *H05K 7/209* (2013.01); *H02J 9/062* (2013.01); *H02M 5/458* (2013.01); *H02M 7/003* (2013.01)

(58) Field of Classification Search
CPC .......... H02M 5/4585; H02M 2001/327; H02J 3/005; H02J 3/006; H02J 9/062
(Continued)

(56) References Cited

U.S. PATENT DOCUMENTS 4,709,318 A * 11/1987 Gephart ................. H02J 9/062
307/66
5,027,264 A * 6/1991 DeDoncker ....... H02M 3/33584
363/129
(Continued)

FOREIGN PATENT DOCUMENTS

CN     1121009 A    4/1996
EP   0 693 820 A1   1/1996
(Continued)

OTHER PUBLICATIONS

SKiiP 28ANB16V1 (SKiiP 28ANB16V1, Datasheet, "3-phase bridge rectifier + brake chopper", SEMIKRON, May 2007).*
(Continued)

*Primary Examiner* — Jue Zhang
*Assistant Examiner* — Jye-June Lee
(74) *Attorney, Agent, or Firm* — Oblon, McClelland, Maier & Neustadt, L.L.P.

(57) ABSTRACT

An uninterruptible power supply apparatus includes a cooler cooling a converter/chopper circuit and a cooler cooling a PWM inverter. The converter/chopper circuit and the cooler make up one integrated unit. Accordingly, a smaller apparatus can be achieved, compared with a conventional apparatus in which a cooler is provided for each of a converter and a chopper.

2 Claims, 11 Drawing Sheets

(51) Int. Cl.
*H02M 7/00* (2006.01)
*H02M 5/458* (2006.01)
*H02M 3/335* (2006.01)

(58) Field of Classification Search
USPC ............ 363/34, 37; 361/709, 710, 714–716; 307/23, 45, 46, 64, 66, 67
See application file for complete search history.

(56) References Cited

U.S. PATENT DOCUMENTS

| | | | | |
|---|---|---|---|---|
| 5,381,330 | A * | 1/1995 | Grundl | H02M 7/538 363/132 |
| 5,625,548 | A * | 4/1997 | Gold | H02M 1/08 363/98 |
| 5,870,286 | A * | 2/1999 | Butterbaugh | H05K 1/0206 361/704 |
| 5,945,746 | A * | 8/1999 | Tracewell | H05K 7/20572 165/104.33 |
| 6,064,578 | A * | 5/2000 | Hashimoto | H02M 7/003 363/16 |
| 6,175,511 | B1 * | 1/2001 | Ooba | H02J 9/062 307/66 |
| 7,212,407 | B2 * | 5/2007 | Beihoff | H02M 1/44 307/43 |
| 8,964,431 | B2 | 2/2015 | Sato et al. | |
| 9,013,063 | B2 | 4/2015 | Sato et al. | |
| 9,154,000 | B2 | 10/2015 | Sato et al. | |
| 2001/0026460 | A1 | 10/2001 | Ito et al. | |
| 2004/0156221 | A1 * | 8/2004 | Youm | H02M 7/53871 363/132 |
| 2006/0125448 | A1 * | 6/2006 | Okui | H02J 9/062 320/138 |
| 2008/0068870 | A1 * | 3/2008 | Eguchi | H02M 3/156 363/37 |
| 2011/0049991 | A1 | 3/2011 | Sato et al. | |

FOREIGN PATENT DOCUMENTS

| | | |
|---|---|---|
| JP | 59 28291 | 2/1984 |
| JP | 7 298516 | 11/1995 |
| JP | 8 33336 | 2/1996 |
| JP | 8 154374 | 6/1996 |
| JP | 9-130995 | 5/1997 |
| JP | 2000-166119 A | 6/2000 |
| JP | 2001 352763 | 12/2001 |
| JP | 2003 259657 | 9/2003 |

OTHER PUBLICATIONS

SKiiP 38AC126V2 (SKiiP 38AC126V2, Datasheet, "3-phase bridge inverter", SEMIKRON, Aug. 2008).*
Assembly of MiniSKiip ("Assembly of MiniSKiip", http://www.farnell.com/datasheets/26682.pdf, Jun. 2006).*
SKiiP 12NAB065V1 (SKiiP 12NAB065V1, Datasheet, 3-phase bridge rectifier + brake chopper + 3-phase bridge inverter, SEMIKRON, May 2007).*
Seri Lee, "Optimum design and selection of heat sinks," in Components, Packaging, and Manufacturing Technology, Part A, IEEE Transactions on , vol. 18, No. 4, pp. 812-817, Dec. 1995.*
International Search Report issued Jun. 23, 2009 in PCT/JP09/055306 filed Mar. 18, 2009.
Office Action issued Sep. 20, 2012 in Korean Patent Application No. 10-2011-7020978 (with English translation).
Korean Office Action Issued Mar. 7, 2013 in Patent Application No. 10-2011-7020978 (with English translation).
Combined Chinese Office Action and Search Report issued Jun. 25, 2013 in Patent Application No. 200980158221.9 with English Translation.
SKiiP 12NAB065V1 (SKiiP 12NAB065V1, Datasheet, "3-phase bridge rectifier + brake chopper + 3-phase bridge inverter", SEMIKRON, May 2007).

* cited by examiner

FIG.10
(a) 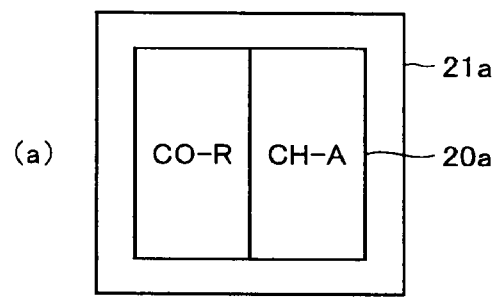
(b) 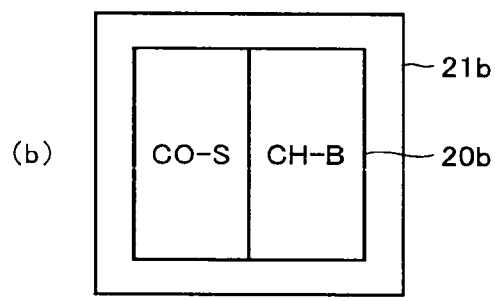
(c) 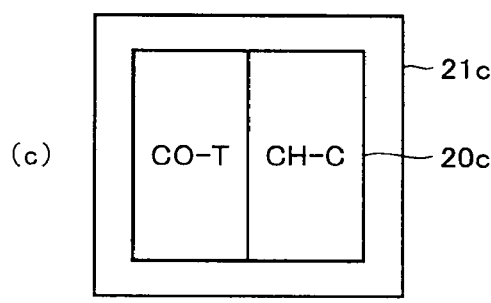
(d) 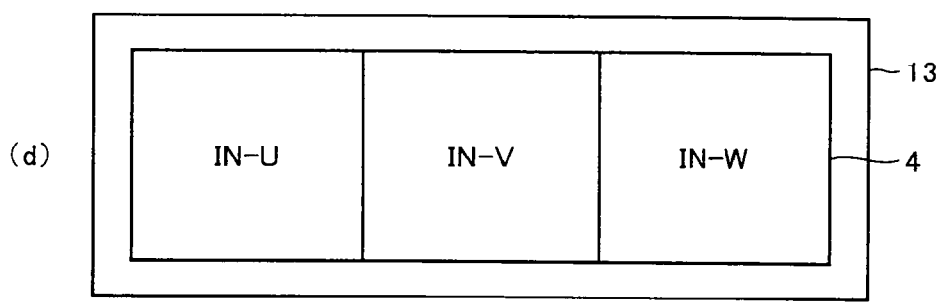

MODULAR UNINTERRUPTIBLE POWER SUPPLY APPARATUS

CROSS REFERENCE TO RELATED APPLICATIONS

This application is a continuation of U.S. application Ser. No. 13/202,478 filed Aug. 19, 2011, which is a National Phase of PCT/JP2009/055306 filed Mar. 18, 2009. The entire contents of each of which are incorporated herein by reference.

TECHNICAL FIELD

The present invention relates to an uninterruptible power supply apparatus, and particularly to an uninterruptible power supply apparatus including a converter, an inverter, and a chopper.

BACKGROUND ART

Conventionally, uninterruptible power supply apparatuses have been widely used as power supply apparatuses for stably supplying alternating current (AC) power to an important load such as a computer system. As shown for example in Japanese Patent Laying-Open No. 07-298516 (Patent Document 1), an uninterruptible power supply apparatus generally includes a converter converting commercial AC power to direct current (DC) power, an inverter converting DC power to AC power and supplying the AC power to a load, and a chopper supplying the DC power generated by the converter to a battery when the commercial AC power is supplied and supplying DC power of the battery to the inverter when the commercial AC power is interrupted.

Patent Document 1: Japanese Patent Laying-Open No. 07-298516

DISCLOSURE OF THE INVENTION

Problems to be Solved by the Invention

However, the conventional uninterruptible power supply apparatus has a problem that it is larger in size because the apparatus is split into three units, namely, the converter, the inverter, and the chopper, and a cooler is provided for each of the units.

Accordingly, a main object of the present invention is to provide a small-sized uninterruptible power supply apparatus.

Means for Solving the Problems

An uninterruptible power supply apparatus in accordance with the present invention includes a converter converting first AC power to DC power, an inverter converting DC power to second AC power, a chopper supplying DC power from the converter to a power storage device when the first AC power is supplied and supplying DC power from the power storage device to the inverter when the supply of the first AC power is stopped, a first cooler cooling the converter and the chopper, and a second cooler cooling the inverter. The converter, the chopper, and the first cooler make up one unit.

Effects of the Invention

In the uninterruptible power supply apparatus in accordance with the present invention, a first cooler cooling a converter and a chopper and a second cooler cooling an inverter are provided, with the converter, the chopper, and the first cooler making up one unit. Therefore, a smaller apparatus can be achieved, compared with a conventional apparatus in which a cooler is provided for each of a converter and a chopper.

BRIEF DESCRIPTION OF THE DRAWINGS

FIG. 10 is a diagram showing a modification of the first embodiment.

DESCRIPTION OF THE REFERENCE SIGNS

1 input filter; 2 PWM converter; 3 chopper; 4 PWM inverter; 5 output filter; 6 battery; 7 commercial AC power supply; 8 load; 11 to 13, 21, 21a to 21c, 33 to 35 cooler; 11a flat plate portion; 11b fin; 20 converter/chopper circuit; 30 to 32 power converting circuit; Q IGBT element; D diode; C capacitor; F fuse; CO-R R-phase part; CO-S S-phase part; CO-T T-phase part; CH-A A-phase part; CH-B B-phase part; CH-C C-phase part; IN-U U-phase part; IN-V V-phase part; IN-W W-phase part.

BEST MODES FOR CARRYING OUT THE INVENTION

Figure 1:
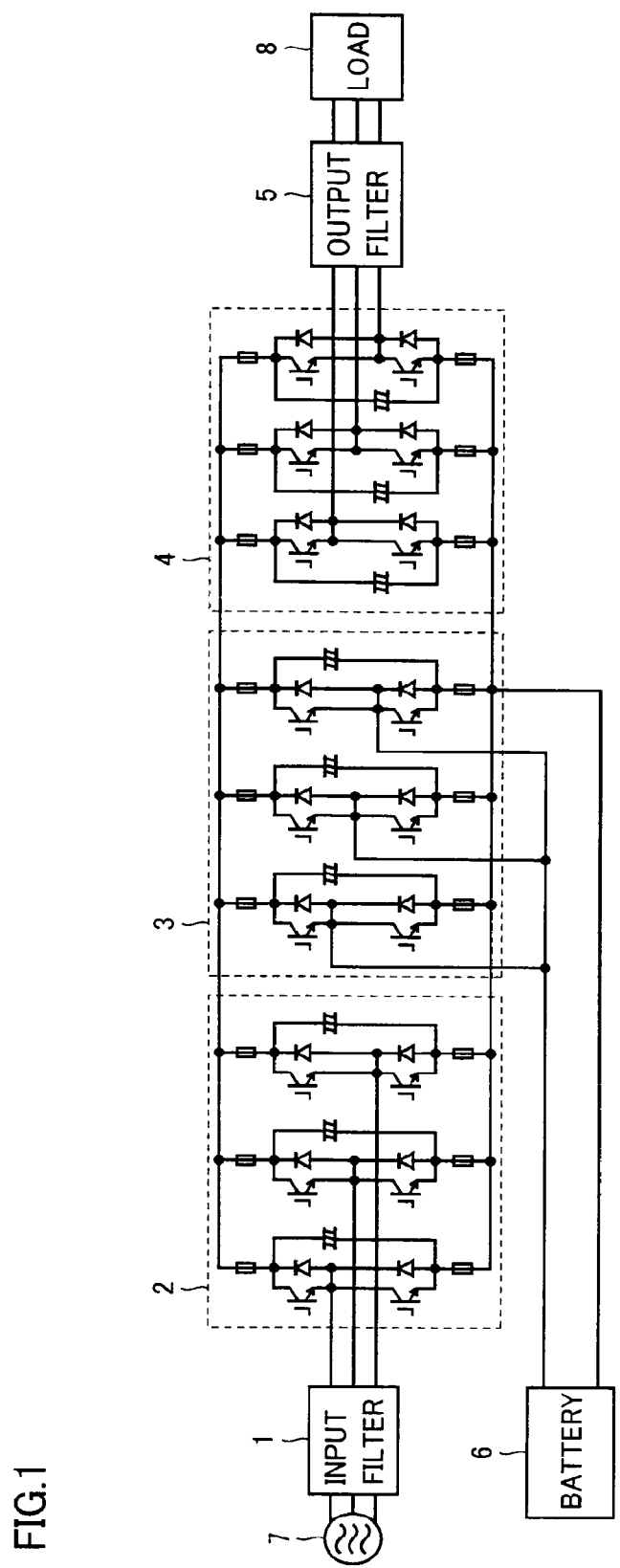
FIG. 1 is a circuit block diagram showing a configuration of an uninterruptible power supply apparatus serving as a basis for the present invention.

Prior to the description of embodiments, the description will be given first of an uninterruptible power supply apparatus serving as a basis for the present invention. As shown in FIG. 1, an uninterruptible power supply apparatus includes an input filter 1, a PWM converter 2, a chopper 3, a PWM inverter 4, an output filter 5, and a battery (power storage device) 6.

Input filter 1 is provided between a commercial AC power supply 7 and PWM converter 2. Input filter 1 is a low-pass filter passing a signal with a frequency of AC voltage (for example, 60 Hz) and cutting a signal with a carrier frequency generated in PWM converter 2 (for example, 10 kHz). Accordingly, the AC voltage is transmitted from commercial AC power supply 7 via input filter 1 to PWM converter 2, and voltage with the carrier frequency generated in PWM converter 2 is cut by input filter 1. This prevents commercial AC power supply 7 from being affected by the voltage with the carrier frequency generated in PWM converter 2.

PWM converter 2 includes a plurality of sets of IGBT (Insulated Gate Bipolar Transistor) elements and diodes, and generates a positive voltage and a negative voltage based on the AC voltage supplied from commercial AC power supply 7 via input filter 1. Each of a plurality of IGBT elements in PWM converter 2 is subjected to PWM control with the carrier frequency, and keeps each of the positive voltage and the negative voltage constant, while maintaining input current in the form of a sine wave and maintaining an input power factor at 1.

Chopper 3 includes a plurality of sets of IGBT elements and diodes, supplies DC power from PWM converter 2 to battery 6 in normal operation, where an AC voltage is supplied from commercial AC power supply 7, and supplies DC power from battery 6 to PWM inverter 4 in power failure, where the supply of the AC voltage from commercial AC power supply 7 is stopped.

PWM inverter 4 includes a plurality of sets of IGBT elements and diodes, and generates AC voltage based on the positive voltage and the negative voltage supplied from PWM converter 2 or chopper 3. Each of a plurality of IGBT elements in PWM inverter 4 is subjected to PWM control with the carrier frequency (for example, 10 kHz) higher than the frequency of the AC voltage (for example, 60 Hz), and maintains output voltage to be a constant sine wave voltage.

Output filter 5 is provided between PWM inverter 4 and a load (for example, a computer system) 8. Output filter 5 is a low-pass filter passing a signal with a frequency of the AC voltage and cutting a signal with the carrier frequency generated in PWM inverter 4. Accordingly, the AC voltage is transmitted from PWM inverter 4 via output filter 5 to load 8, and voltage with the carrier frequency generated in PWM inverter 4 is cut by output filter 5. This prevents load 8 from being affected by the voltage with the carrier frequency generated in PWM inverter 4.

Figure 2:
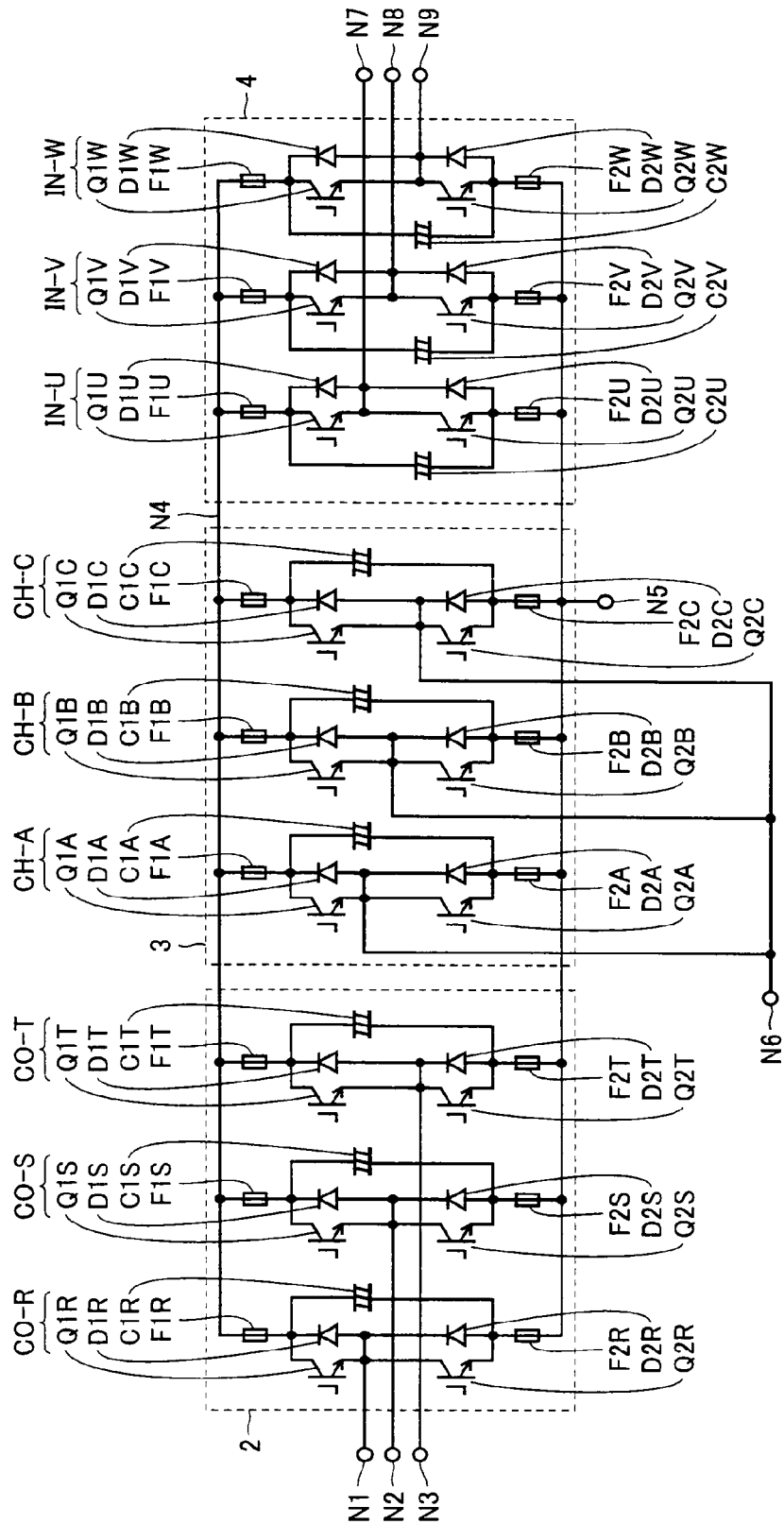
FIG. 2 is a circuit diagram showing configurations of a PWM converter, a chopper, and a PWM inverter shown in FIG. 1.

FIG. 2 is a circuit diagram showing configurations of PWM converter 2, chopper 3, and PWM inverter 4. In FIG. 2, PWM converter 2 includes IGBT elements Q1R, Q2R, Q1S, Q2S, Q1T, Q2T, diodes D1R, D2R, D1S, D2S, D1T, D2T, capacitors C1R, C1S, C1T, and fuses F1R, F2R, F1S, F2S, F1T, F2T. Input nodes N1 to N3 of PWM converter 2 each receive a three-phase AC voltage from commercial AC power supply 7 via input filter 1.

The collectors of IGBT elements Q1R, Q1S, Q1T are connected to a positive voltage node N4 via fuses F1R, F1S, F1T, respectively, and their emitters are connected to nodes N1 to N3, respectively. The collectors of IGBT elements Q2R, Q2S, Q2T are connected to nodes N1 to N3, respectively, and their emitters are connected to a negative voltage node N5 via fuses F2R, F2S, F2T, respectively.

Diodes D1R, D2R, D1S, D2S, D1T, D2T are connected in antiparallel to IGBT elements Q1R, Q2R, Q1S, Q2S, Q1T, Q2T, respectively. Each of capacitors C1R, C1S, C1T has one terminal connected to the collector of a respective one of IGBT elements Q1R, Q1S, Q1T, and the other terminal connected to the emitter of a respective one of IGBT elements Q2R, Q2S, Q2T.

In normal operation, where a three-phase AC voltage is supplied from commercial AC power supply 7, each of IGBT elements Q1R, Q2R, Q1S, Q2S, Q1T, Q2T is subjected to ON/OFF control with timing depending on the phase of the three-phase AC voltage. This causes node N4 to be charged with positive voltage and causes node N5 to be charged with negative voltage. Further, in power failure, where the supply of the three-phase AC voltage from commercial AC power supply 7 is stopped, each of IGBT elements Q1R, Q2R, Q1S, Q2S, Q1T, Q2T is fixed in an OFF state.

It should be noted that if overcurrent flows for some reasons, fuses F1R, F2R, F1S, F2S, F1T, F2T are blown to protect the circuit. Further, capacitors C1R, C1S, C1T smooth and stabilize the voltages of nodes N4, N5.

Further, chopper 3 includes IGBT elements Q1A, Q2A, Q1B, Q2B, Q1C, Q2C, diodes D1A, D2A, D1B, D2B, D1C, D2C, capacitors C1A, C1B, C1C, and fuses F1A, F2A, F1B, F2B, F1C, F2C. Chopper 3 has an input/output node N6 connected to a positive electrode of battery 6, and node N5 is connected to a negative electrode of battery 6.

The collectors of IGBT elements Q1A, Q1B, Q1C are connected to node N4 via fuses F1A, F1B, F1C, respectively, and their emitters are connected to node N6 together. The collectors of IGBT elements Q2A, Q2B, Q2C are connected to node N6 together and their emitters are connected to node N5 via fuses F2A, F2B, F2C, respectively.

Diodes D1A, D2A, D1B, D2B, D1C, D2C are connected in antiparallel to IGBT elements Q1A, Q2A, Q1B, Q2B, Q1C, Q2C, respectively. Each of capacitors C1A, C1B, C1C has one end connected to the collector of a respective one of IGBT elements Q1A, Q1B, Q1C, and the other end connected to the emitter of a respective one of IGBT elements Q2A, Q2B, Q2C.

In normal operation, where a three-phase AC voltage is supplied from commercial AC power supply 7, each of IGBT elements Q1A, Q2A, Q1B, Q2B, Q1C, Q2C is subjected to ON/OFF control with timing depending on the phase of the three-phase AC voltage. This causes very small DC power to be supplied to battery 6 and causes battery 6 to be charged. Further, in power failure, where the supply of the three-phase AC voltage from commercial AC power supply 7 is stopped, each of IGBT elements Q1A, Q2A, Q1B, Q2B, Q1C, Q2C is subjected to ON/OFF control with a predetermined frequency, and DC power is supplied from battery 6 to inverter 4.

It should be noted that in power failure, chopper 3 has to provide the same power to PWM inverter 4 as that provided by PWM converter 2, and therefore, chopper 3 has a current-driving capacity set at the same level as that of PWM converter 2. For this reason, chopper 3 is configured of IGBT elements Q, diodes D, capacitors C, and fuses F that are identical to those of PWM converter 2 in number and size.

Further, it should be noted that if overcurrent flows for some reasons, fuses F1A, F2A, F1B, F2B, F1C, F2C are blown to protect the circuit. Further, capacitors C1A, C1B, C1C smooth and stabilize the voltage of nodes N4, N5.

Further, PWM inverter 4 includes IGBT elements Q1U, Q2U, Q1V, Q2V, Q1W, Q2W, diodes D1U, D2U, D1V, D2V, D1W, D2W, capacitors C1U, C1V, C1W, and fuses F1U, F2U, F1V, F2V, F1W, F2W. PWM inverter 4 has output nodes N7 to N9 which are each connected to load 8 via output filter 5.

The collectors of IGBT elements Q1U, Q1V, Q1W are connected to node N4 via fuses F1U, F1V, F1W, respectively, and their emitters are connected to nodes N7 to N9, respectively. The collectors of IGBT elements Q2U, Q2V, Q2W are connected to nodes N7 to N9, respectively, and their emitters are connected to node N5 via fuses F2U, F2V, F2W, respectively.

Diodes D1U, D2U, D1V, D2V, D1W, D2W are connected in antiparallel to IGBT elements Q1U, Q2U, Q1V, Q2V, Q1W, Q2W, respectively. Each of capacitors C1U, C1V, C1W has one terminal connected to the collector of a respective one of IGBT elements Q1U, Q1V, Q1W, and the other terminal connected to the emitter of a respective one of IGBT elements Q2U, Q2V, Q2W.

Each of IGBT elements Q1U, Q2U, Q1V, Q2V, Q1W, Q2W is subjected to ON/OFF control with timing depending on the phase of the three-phase AC voltage. This causes a three-phase AC voltage to be outputted to nodes N7 to N9. Therefore, even in power failure, a three-phase AC voltage is supplied to load 8 as long as DC power is supplied from battery 6.

It should be noted that if overcurrent flows for some reasons, fuses F1U, F2U, F1V, F2V, F1W, F2W are blown to protect the circuit. Further, capacitors C1U, C1V, C1W smooth and stabilize the voltages of nodes N4, N5.

Figure 3:
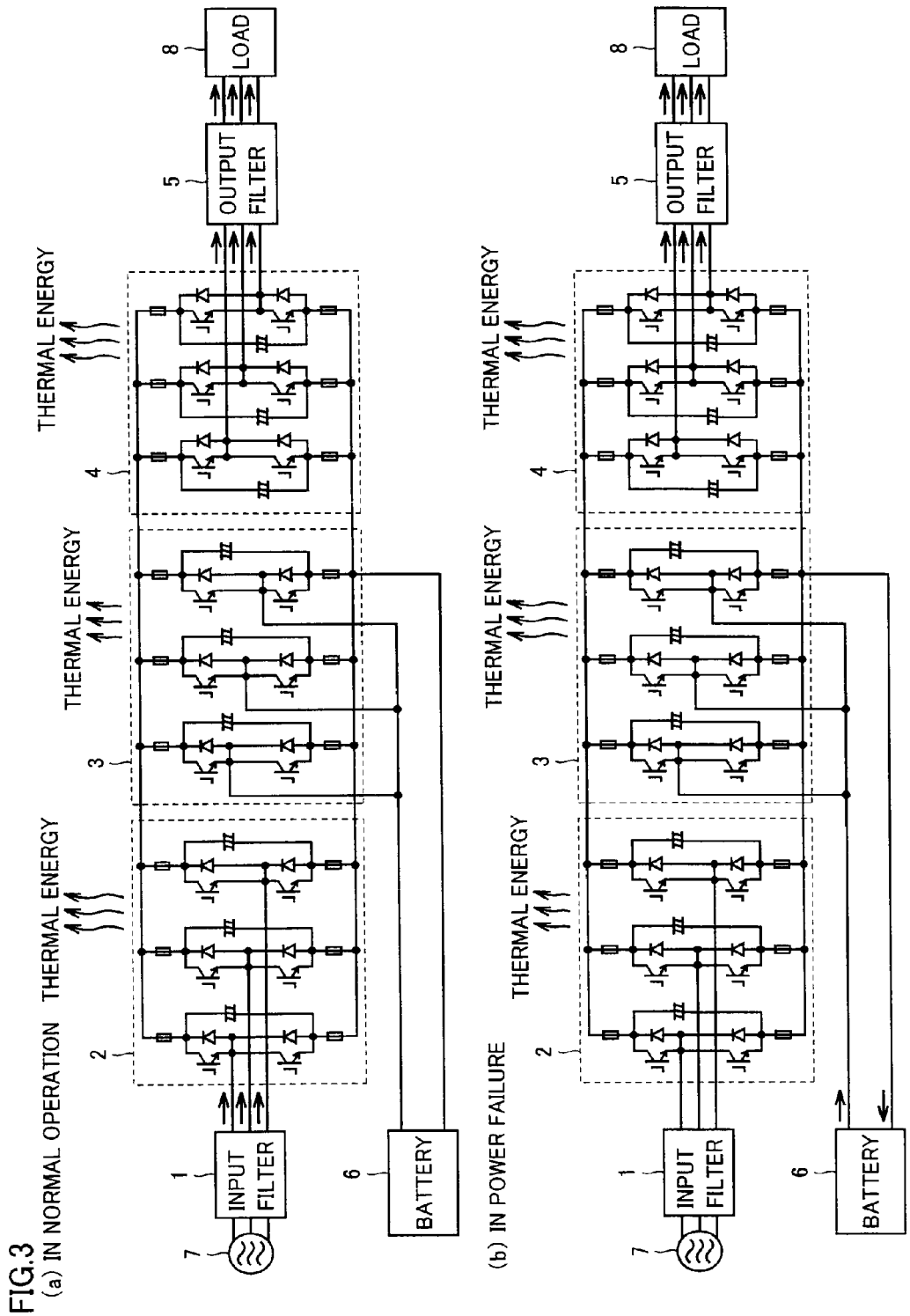
FIG. 3 is a circuit block diagram schematically showing thermal energy generated in the uninterruptible power supply apparatus shown in FIG. 1.

As shown in FIGS. 3 (a) and (b), when PWM converter 2, chopper 3 and PWM inverter 4 are operated, thermal energy is generated in IGBT elements Q and diodes D. However, in normal operation, where AC power is supplied from commercial AC power supply 7, a high thermal energy is generated in PWM converter 2 and PWM inverter 4, while a low thermal energy is generated in chopper 3, as shown in FIG. 3 (a). Further, in power failure, where the supply of power from commercial AC power supply 7 is stopped and power is supplied from battery 6, a high thermal energy is generated in chopper 3 and PWM inverter 4, while a low thermal energy is generated in PWM converter 2 is small.

Figure 4:
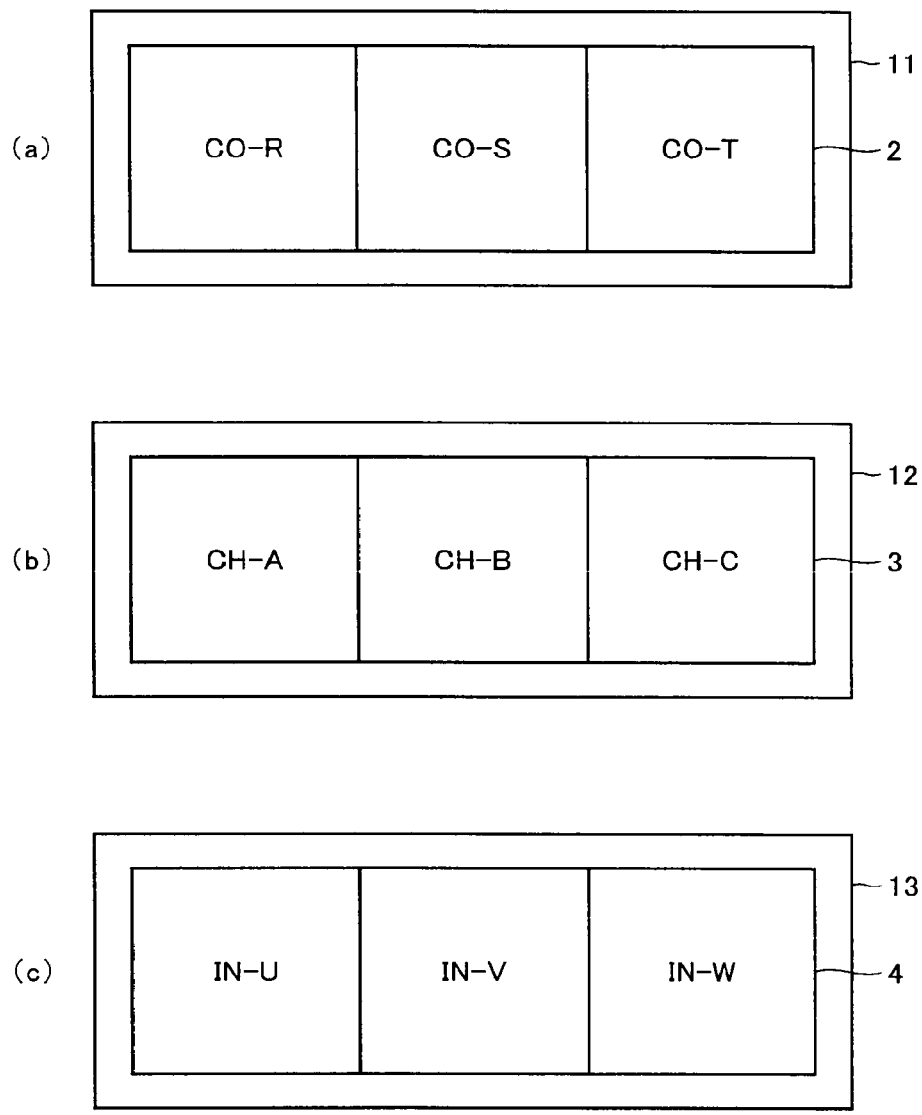
FIG. 4 shows a method for cooling the PWM converter, the chopper, and the PWM inverter shown in FIG. 3.

Further, as shown in FIG. 4 (a) to (c), PWM converter 2, chopper 3 and PWM inverter 4 are fixed on coolers 11 to 13, respectively. Thermal energy generated in PWM converter 2, chopper 3 and PWM inverter 4 is transmitted to coolers 11 to 13, respectively. Thermal energy of coolers 11 to 13 is dissipated into the air. This suppresses increase of the temperature of PWM converter 2, chopper 3 and PWM inverter 4.

Further, in FIG. 4 (a), PWM converter 2 has an R-phase part CO-R, an S-phase part CO-S and a T-phase part CO-T, which are arranged on the surface of cooler 11 in sequence. R-phase part CO-R is a portion corresponding to the R-phase of a three-phase AC voltage from commercial AC power supply 7, and includes elements having R at the end of their reference signs in PWM converter 2 of FIG. 2. S-phase part CO-S is a portion corresponding to the S-phase of the three-phase AC voltage from commercial AC power supply 7, and includes elements having S at the end of their reference signs in PWM converter 2 of FIG. 2. T-phase part CO-T is a portion corresponding to the T-phase of the three-phase AC voltage from commercial AC power supply 7, and includes elements having T at the end of their reference signs in PWM converter 2 of FIG. 2.

Furthermore, in FIG. 4 (b), chopper 3 has an A-phase part CH-A, a B-phase part CH-B and a C-phase part CH-C, which are arranged on the surface of cooler 12 in sequence. A-phase part CH-A is a portion corresponding to the R-phase of PWM converter 2, and includes elements having A at the end of their reference signs in chopper 3 of FIG. 2. B-phase part CH-B is a portion corresponding to the S-phase of PWM converter 2, and includes elements having B at the end of their reference signs in chopper 3 of FIG. 2. C-phase part CH-C is a portion corresponding to the T-phase of PWM converter 2, and includes elements having C at the end of their reference signs in chopper 3 of FIG. 2.

Still further, in FIG. 4 (c), PWM inverter 4 has a U-phase part IN-U, a V-phase part IN-V and a W-phase part IN-W, which are arranged on the surface of cooler 13 in sequence. U-phase part IN-U is a portion corresponding to the U-phase of a three-phase AC voltage to be supplied to load 8, and includes elements having U at the end of their reference signs in PWM inverter 4 of FIG. 2. V-phase part IN-V is a portion corresponding to the V-phase of the three-phase AC voltage to be supplied to load 8, and includes elements having V at the end of their reference signs in PWM inverter 4 of FIG. 2. W-phase part IN-W is a portion corresponding to the W-phase of the three-phase AC voltage to be supplied to load 8, and includes elements having W at the end of their reference signs in PWM inverter 4 of FIG. 2.

Figure 5:
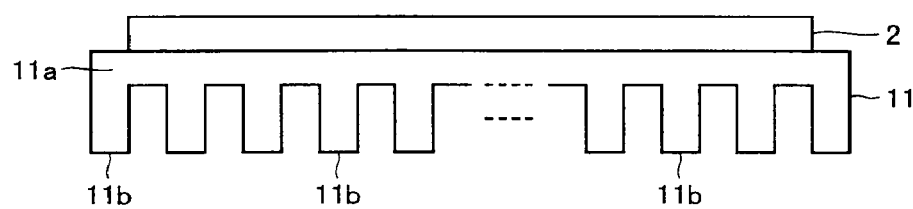
FIG. 5 shows a configuration of a cooler shown in FIG. 4.

Further, cooler 11 is formed of a metal having a high thermal conductivity (for example, aluminum), and includes a flat plate portion 11a and a plurality of fins 11b provided on the back of flat plate portion 11a, as shown in FIG. 5. PWM converter 2 is fixed on the surface of flat plate portion 11a in such a manner that thermal energy generated in IGBT elements Q and diodes D is conducted to flat plate portion 11a. Thermal energy of flat plate portion 11a is dissipated from the surfaces of the plurality of fins 11b into the air. Other coolers 12, 13 also have the same configuration as that of cooler 11. Each of PWM converter 2 together with cooler 11, chopper 3 together with cooler 12, and PWM inverter 4 together with cooler 13, makes up one unit.

Further, cooling capacity of a cooler depends on its size, and increases according to the size. The time period during which chopper 3 is actually used as a result of occurrence of power failure is short, however, in use, the same level of thermal energy as that in PWM converter 2 is generated, and therefore, cooler 12 having the same size as that of cooler 11 of PWM converter 2 is utilized for chopper 3. Further, thermal energy generated in PWM converter 2 and thermal energy generated in PWM inverter 4 is approximately of the same level. Accordingly, coolers 11 to 13 are identical in size.

It should be noted that PWM converter 2, chopper 3 and PWM inverter 4 might be mounted on one large cooler; however, this would result in a larger apparatus. Use of three coolers 11 to 13 can provide a compact apparatus, for example by stacking up the coolers vertically. However, there remains a problem in the uninterruptible power supply apparatus shown in FIGS. 1 to 5 that the apparatus size is still large. This problem is solved in the embodiments below.

First Embodiment

Figure 6:
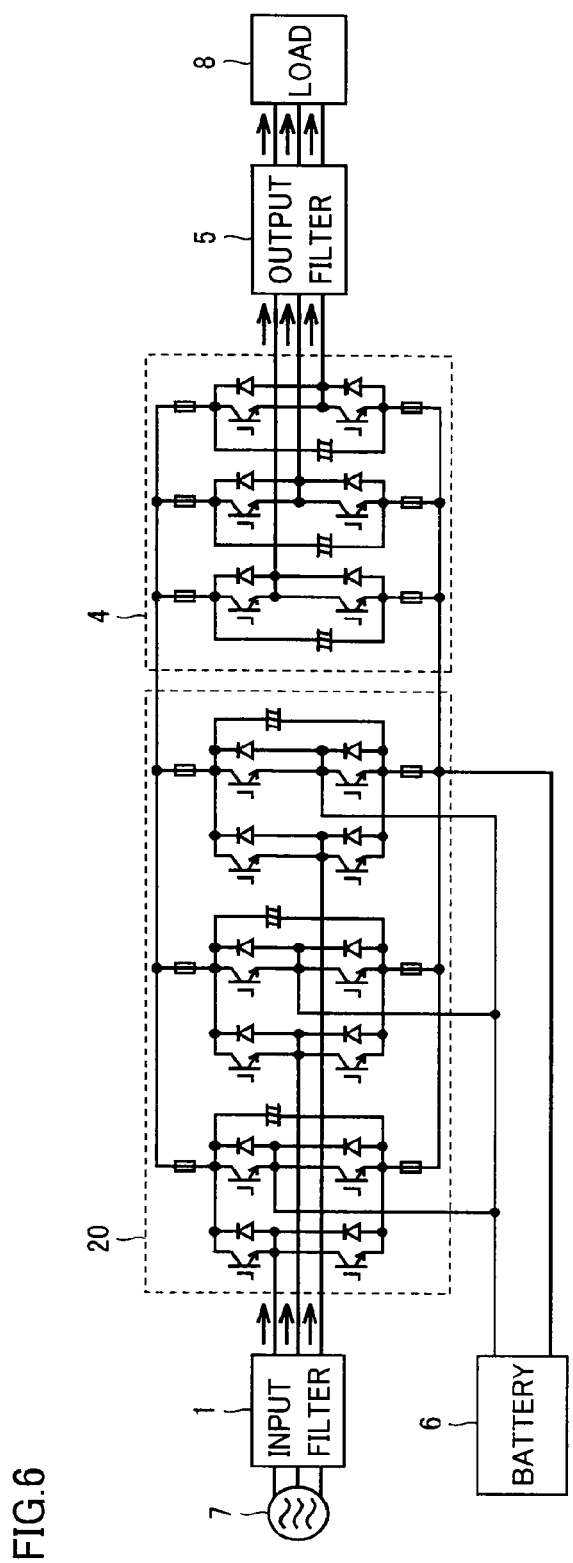
FIG. 6 is a circuit block diagram showing a configuration of an uninterruptible power supply apparatus according to a first embodiment of the present invention.

FIG. 6 is a circuit block diagram to be compared with FIG. 1 and shows a configuration of an uninterruptible power supply apparatus according to a first embodiment of the present invention. In FIG. 6, this uninterruptible power supply apparatus differs from the uninterruptible power supply apparatus of FIG. 1 in that a converter/chopper circuit 20 substitutes for PWM converter 2 and chopper 3. Converter/chopper circuit 20 is formed by integrating PWM converter 2 and chopper 3 into one circuit.

Figure 7:
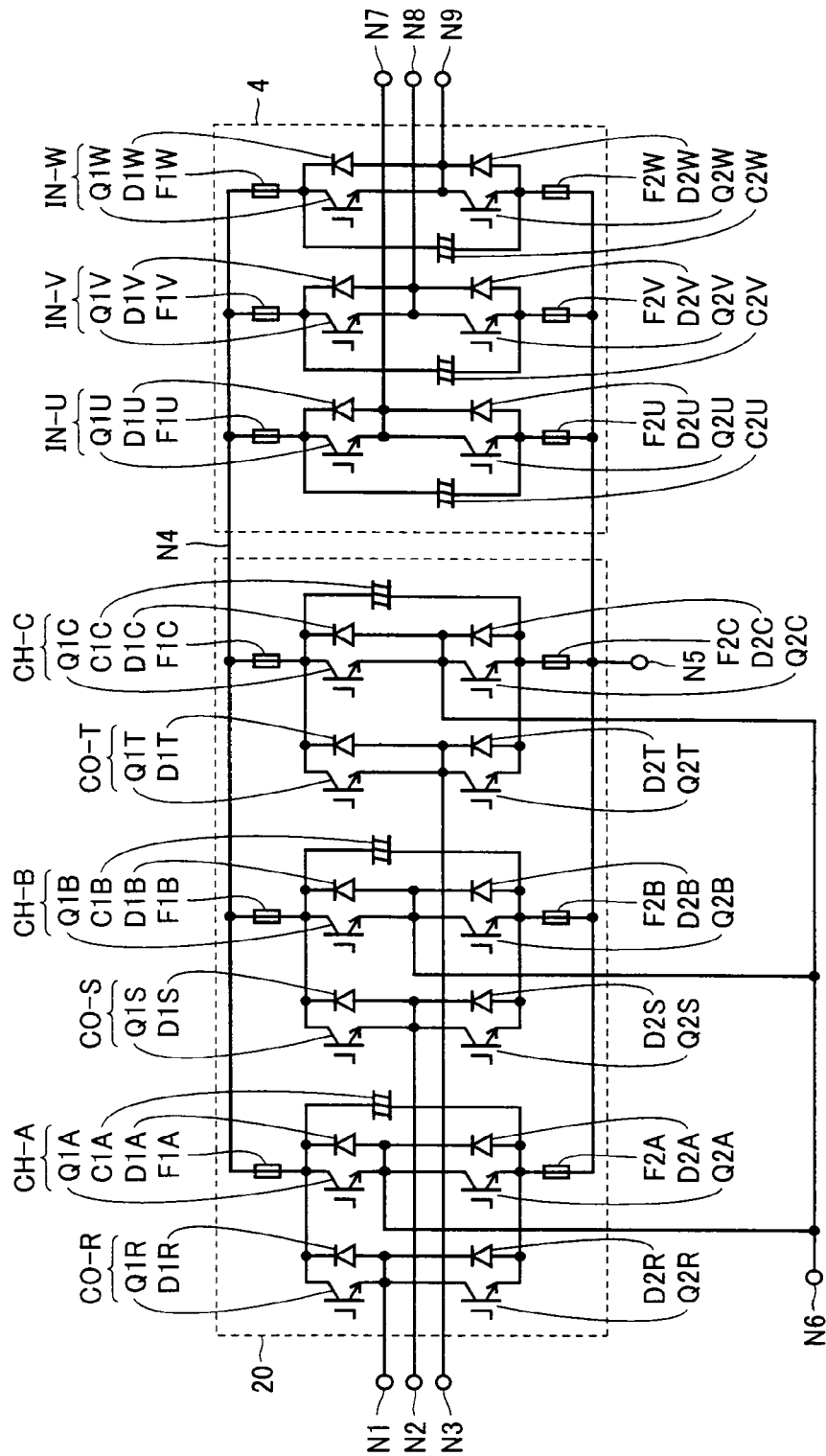
FIG. 7 is a circuit diagram showing configurations of a converter/chopper circuit and a PWM inverter shown in FIG. 6.

Further, FIG. 7 is a circuit diagram to be compared with FIG. 2 and shows configurations of a converter/chopper circuit 20 and PWM inverter 4. In FIG. 7, converter/chopper circuit 20 is formed by arranging R-phase part CO-R, S-phase part CO-S and T-phase part CO-T of PWM converter 2 alternately with A-phase part CH-A, B-phase part CH-B and C-phase part CH-C of chopper 3 one by one and eliminating capacitors C1R, C1S, C1T and fuses F1R, F2R, F1S, F2S, F1T, F2T of PWM converter 2. Since PWM converter 2 is used in normal operation and chopper 3 is used mainly in power failure, it is possible for PWM converter 2 and chopper 3 to share capacitors C1A, C1B, C1C and fuses F1A, F2A, F1B, F2B, F1C, F2C. This allows for reduced parts count, and therefore, a smaller size of the device and reduced costs of the device can be achieved.

A detailed description will be given below. A-phase part CH-A, B-phase part CH-B and C-phase part CH-C are as shown in FIG. 1. Capacitor C1R and fuses F1R, F2R are eliminated from R-phase part CO-R, the collector of IGBT element Q1R is connected to the collector of IGBT element Q1A, and the emitter of IGBT element Q2R is connected to the emitter of IGBT element Q2A.

Capacitor C1S and fuses F1S, F2S are eliminated from S-phase part CO-S, the collector of IGBT element Q1S is connected to the collector of IGBT element Q1B, and the emitter of IGBT element Q2S is connected to the emitter of IGBT element Q2B. Capacitor C1T and fuses F1T, F2T are eliminated from T-phase part CO-T, the collector of IGBT element Q1T is connected to the collector of IGBT element Q1C, and the emitter of IGBT element Q2T is connected to the emitter of IGBT element Q2C. ON/OFF control of IGBT elements Q is performed in the same manner as in the circuit of FIG. 2.

Figure 8:
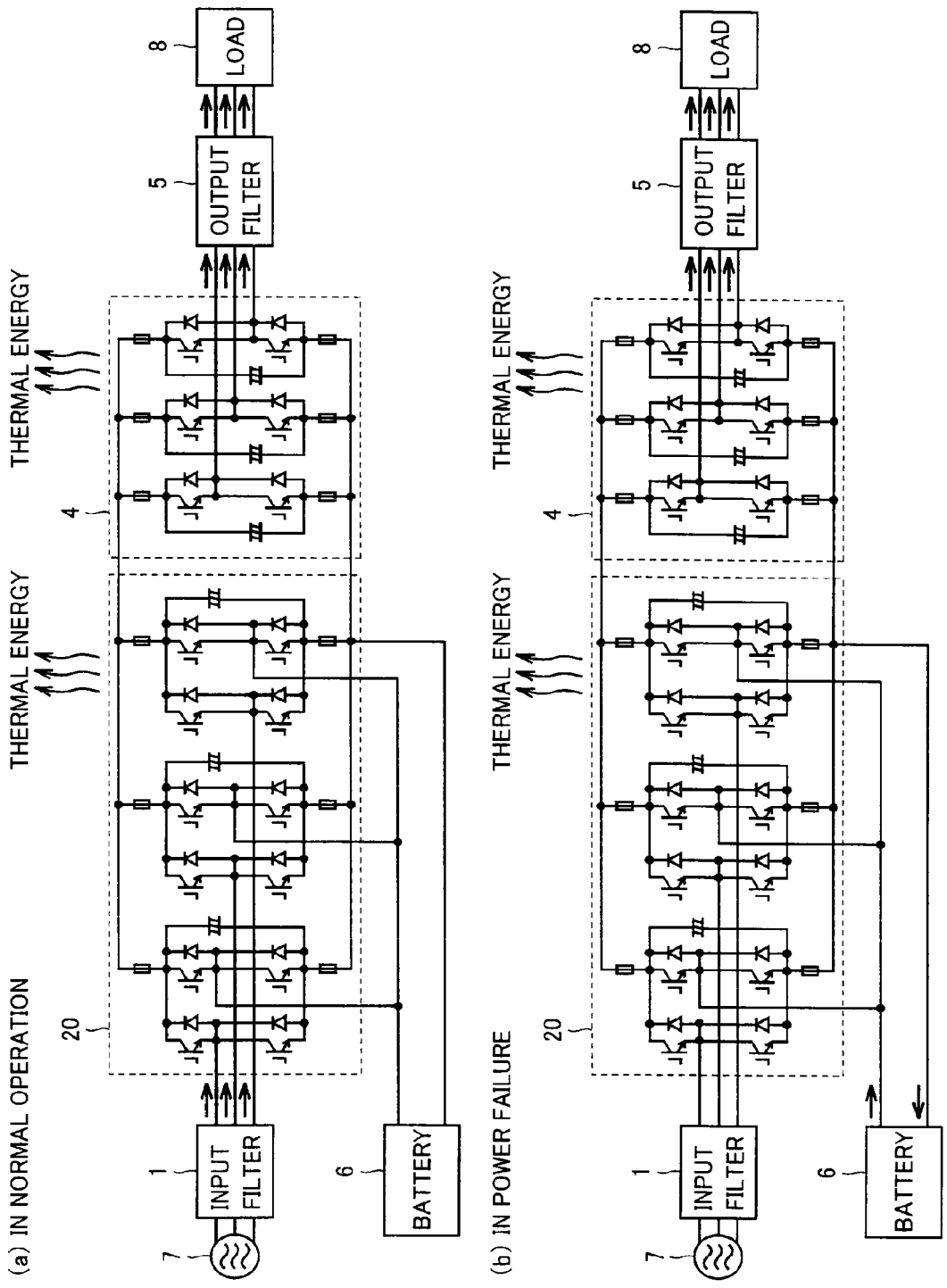
FIG. 8 is a circuit block diagram schematically showing thermal energy generated in the uninterruptible power supply apparatus shown in FIG. 6.

Further, as shown in FIGS. 8 (a) and (b), when converter/chopper circuit 20 and PWM inverter 4 are operated, thermal energy is generated in IGBT elements Q and diodes D. In this uninterruptible power supply apparatus, in normal operation, R-phase part CO-R, S-phase part CO-S and T-phase part CO-T of converter/chopper circuit 20 as well as PWM inverter 4 are operated, and a high thermal energy is generated in each of converter/chopper circuit 20 and PWM inverter 4, as shown in FIG. 8 (a). Further, in power failure, A-phase part CH-A, B-phase part CH-B and C-phase part CH-C of converter/chopper circuit 20 as well as PWM inverter 4 are operated, and a high thermal energy is generated in each of converter/chopper circuit 20 and PWM inverter 4. Accordingly, regardless of whether in normal operation or in power failure, thermal energy generated in converter/chopper circuit 20 and thermal energy generated in inverter 4 is approximately of the same level. Therefore, a cooler for converter/chopper circuit may be the same as cooler 13 for PWM inverter 4.

Figure 9:
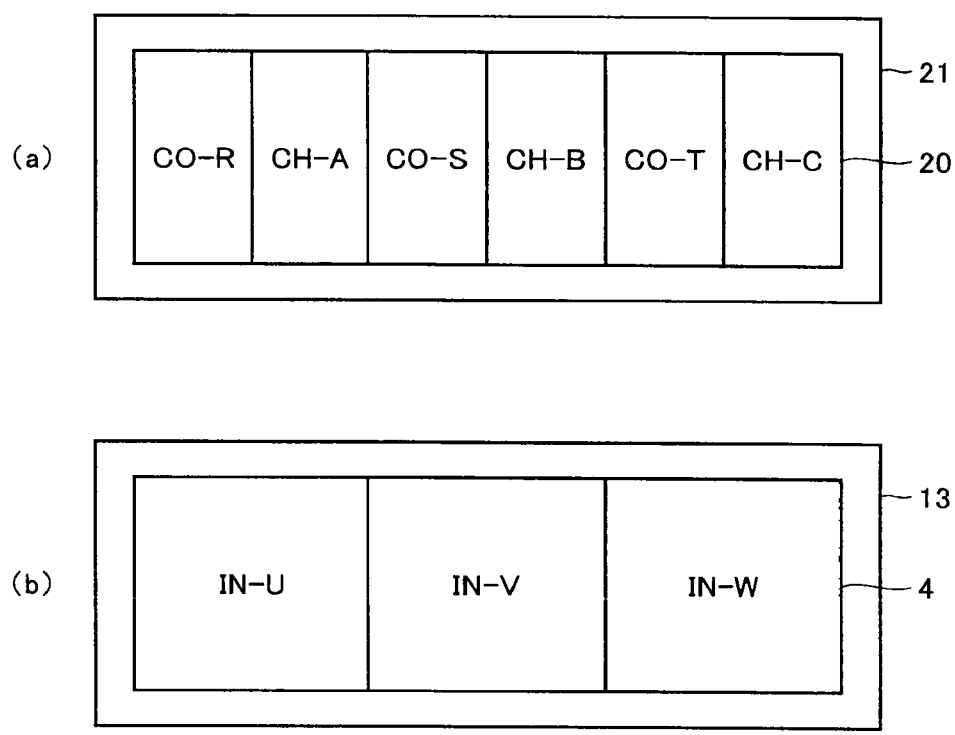
FIG. 9 shows a method for cooling the converter/chopper circuit and the PWM inverter shown in FIG. 6.

Further, as shown in FIGS. 9 (a) and (b), converter/chopper circuit 20 and PWM inverter 4 are fixed on coolers 21, 13, respectively. Thermal energy generated in converter/chopper circuit 20 and thermal energy generated in PWM inverter 4 is transmitted to coolers 21, 13, respectively. Thermal energy of coolers 21, 13 is dissipated into the air. This suppresses increase of the temperature of converter/chopper circuit 20 and PWM inverter 4.

Further, in FIG. 9 (a), converter/chopper circuit 20 has R-phase part CO-R, A-phase part CH-A, S-phase part CO-S, B-phase part CH-B, T-phase part CO-T, and C-phase part CH-C, which are arranged on the surface of cooler 20 in sequence. R-phase part CO-R is a portion corresponding to the R-phase of a three-phase AC voltage from commercial AC power supply 7, and includes elements having R at the end of their reference signs in converter/chopper circuit 20 of FIG. 7. A-phase part CH-A is a portion corresponding to the R-phase of converter/chopper circuit 20, and includes elements having A at the end of their reference signs in converter/chopper circuit 20 of FIG. 7.

S-phase part CO-S is a portion corresponding to the S-phase of the three-phase AC voltage from commercial AC power supply 7, and includes elements having S at the end of their reference signs in converter/chopper circuit 20 of FIG. 7. B-phase part CH-B is a portion corresponding to the S-phase of converter/chopper circuit 20, and includes elements having B at the end of their reference signs in converter/chopper circuit 20 of FIG. 7.

T-phase part CO-T is a portion corresponding to the T-phase of the three-phase AC voltage from commercial AC power supply 7, and includes elements having T at the end of their reference signs in converter/chopper circuit 20 of FIG. 7. C-phase part CH-C is a portion corresponding to the C-phase of converter/chopper circuit 20, and includes elements having C at the end of their reference signs in converter/chopper circuit 20 of FIG. 7.

Furthermore, in FIG. 9 (b), PWM inverter 4 has U-phase part IN-U, V-phase part IN-V and W-phase part IN-W, which are arranged on the surface of cooler 13 in sequence. Further, cooler 21 is the same as cooler 11 in FIG. 5. Each of converter/chopper circuit 20 together with cooler 21 and PWM inverter 4 together with cooler 13 makes up one unit.

In the first embodiment, the converter and the chopper share capacitors C, fuses F and cooler 21, and therefore, a smaller apparatus can be achieved.

It should be noted that as shown in FIG. 10 (a) to (d), converter/chopper circuit 20 may be split into three converter/chopper circuits 20a to 20c and that cooler 21 may be split into three coolers 21a to 21c, with converter/chopper circuits 20a to 20c being fixed on coolers 21a to 21c, respectively. Converter/chopper circuit 20a includes R-phase part CO-R and A-phase part CH-A, and converter/chopper circuit 20b includes S-phase part CO-S and B-phase part CH-B, and converter/chopper circuit 20c includes T-phase part CO-T and C-phase part CH-C. Each of converter/chopper circuit 20a together with cooler 21a, converter/chopper circuit 20b together with cooler 21b, and converter/chopper circuit 20c together with cooler 21c makes up one unit. This modification can also provide the same effects as those in the first embodiment.

Second Embodiment

Figure 11:
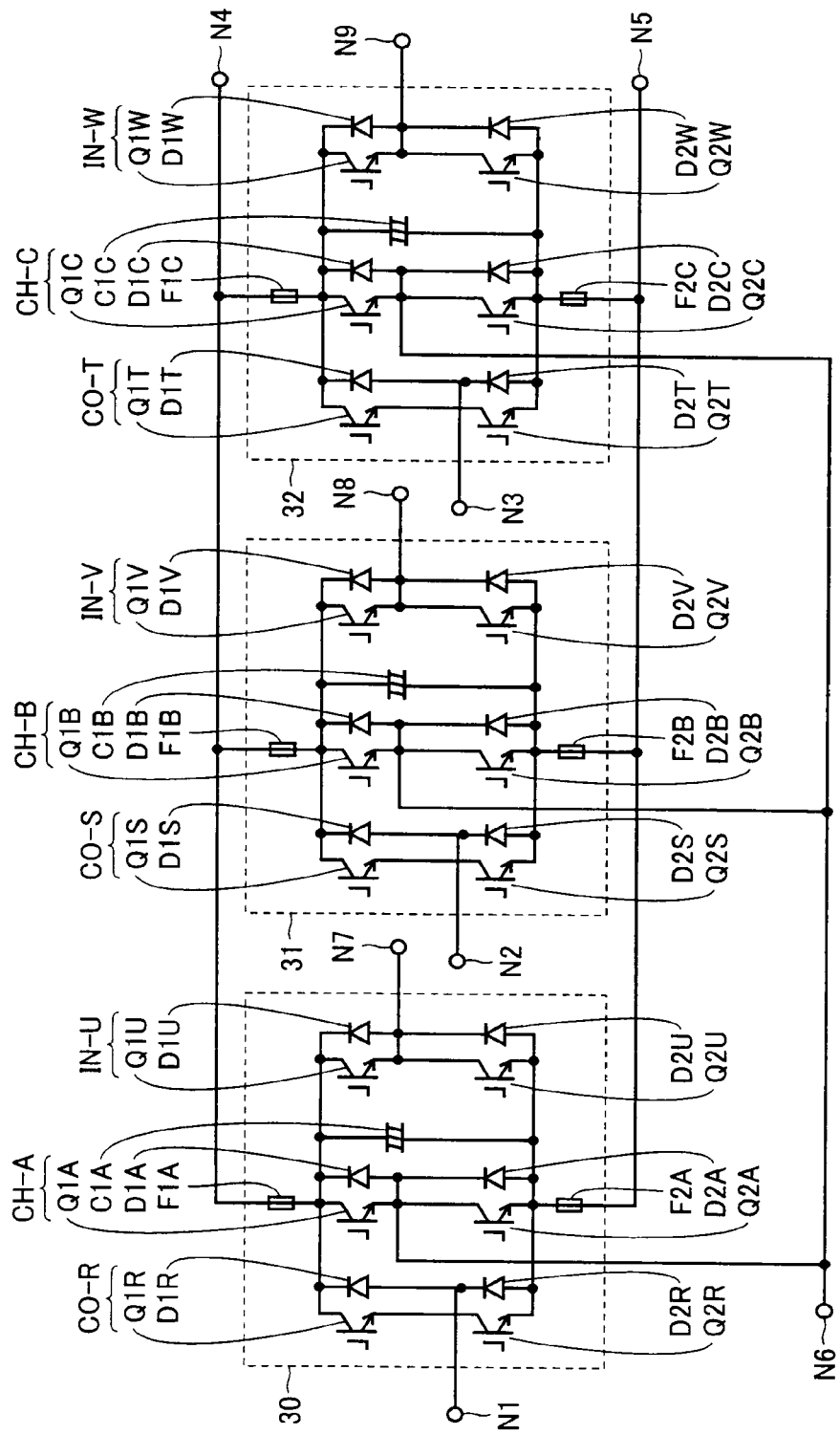
FIG. 11 is a circuit block diagram showing a relevant part of an uninterruptible power supply apparatus according to a second embodiment of the present invention.

FIG. 11 is a circuit diagram to be compared with FIG. 2 and shows a relevant part of an uninterruptible power supply apparatus according to a second embodiment of the present invention. In FIG. 11, this uninterruptible power supply apparatus differs from the uninterruptible power supply apparatus of FIG. 2 in that three power converting circuit 30 to 32 substitute for PWM converter 2, chopper 3 and PWM inverter 4.

Power converting circuit 30 is formed by integrating R-phase part CO-R, A-phase part CH-A, and U-phase part IN-U and eliminating capacitors C1R, C1U and fuses F1R, F2R, F1U, F2U. Power converting circuit 31 is formed by integrating S-phase part CO-S, B-phase part CH-B, and V-phase part IN-V and eliminating capacitors C1S, C1V and fuses F1S, F2S, F1V, F2V. Power converting circuit 32 is formed by integrating T-phase part CO-T, C-phase part CH-C, and W-phase part IN-W and eliminating capacitors C1T, C1W and fuses F1T, F2T, F1W, F2W.

Since PWM converter 2 is used in normal operation and chopper 3 is used mainly in power failure, it is possible for PWM converter 2 and chopper 3 to share capacitors C1A, C1B, C1C and fuses F1A, F2A, F1B, F2B, F1C, F2C. Further, if fuse F of any one of PWM converter, chopper 3 and PWM inverter 4 is blown, the uninterruptible power supply apparatus will become unusable as a whole. Thus, it is possible for PWM converter 2, chopper 3 and PWM inverter 4 to share fuses F1A, F2A, F1B, F2B, F1C, F2C. This allows for reduced parts count, and therefore, a smaller size of the device and reduced costs of the device can be achieved.

A detailed description will be given below. A-phase part CH-A, B-phase part CH-B and C-phase part CH-C are as shown in FIG. 1. Capacitor C1R and fuses F1R, F2R are eliminated from R-phase part CO-R, the collector of IGBT element Q1R is connected to the collector of IGBT element Q1A, and the emitter of IGBT element Q2R is connected to the emitter of IGBT element Q2A. Capacitor C1U and fuses F1U, F2U are eliminated from U-phase part IN-U, the collector of IGBT element Q1U is connected to the collector of IGBT element Q1A, and the emitter of IGBT element Q2U is connected to the emitter of IGBT element Q2A.

Capacitor C1S and fuses F1S, F2S are eliminated from S-phase part CO-S, the collector of IGBT element Q1S is connected to the collector of IGBT element Q1B, and the emitter of IGBT element Q2S is connected to the emitter of IGBT element Q2B. Capacitor C1V and fuses F1V, F2V are eliminated from V-phase part IN-V, the collector of IGBT element Q1V is connected to the collector of IGBT element Q1B, and the emitter of IGBT element Q2V is connected to the emitter of IGBT element Q2B.

Capacitor C1T and fuses F1T, F2T are eliminated from T-phase part CO-T, the collector of IGBT element Q1T is connected to the collector of IGBT element Q1C, and the emitter of IGBT element Q2T is connected to the emitter of IGBT element Q2C. Capacitor C1W and fuses F1W, F2W are eliminated from W-phase part IN-W, the collector of IGBT element Q1W is connected to the collector of IGBT element Q1C, and the emitter of IGBT element Q2W is connected to the emitter of IGBT element Q2C. ON/OFF control of IGBT elements Q is performed in the same manner as in the circuit of FIG. 2.

Further, when power converting circuits 30 to 32 are operated, thermal energy is generated in IGBT elements Q and diodes D. In this uninterruptible power supply apparatus, in normal operation, R-phase part CO-R and U-phase part IN-U of power converting circuit 30, S-phase part CO-S and V-phase part IN-V of power converting circuit 31, and T-phase part CO-T and W-phase part IN-W of power converting circuit 32 are operated, and a high thermal energy is generated in each of power converting circuits 30 to 32.

Further, in power failure, A-phase part CH-A and U-phase part IN-U of power converting circuit 30, B-phase part CH-B and V-phase part IN-V of power converting circuit 31, and C-phase part CH-C and W-phase part IN-W of power converting circuit 32 are operated, and a high thermal energy is generated in each of power converting circuits 30 to 32. Accordingly, regardless of whether in normal operation or in power failure, thermal energy generated in each of power converting circuits 30 to 32 is approximately of the same level. Further, since the number of IGBT elements Q driven in each of power converting circuits 30 to 32 is two thirds of the number of IGBT elements Q driven in PWM inverter 4, the thermal energy generated in each of power converting circuits 30 to 32 is two thirds of the thermal energy generated in PWM inverter 4. Accordingly, a size of two thirds of the size of cooler 13 for PWM inverter 4 is sufficient for each of coolers for power converting circuits 30 to 32 to have.

Figure 12:
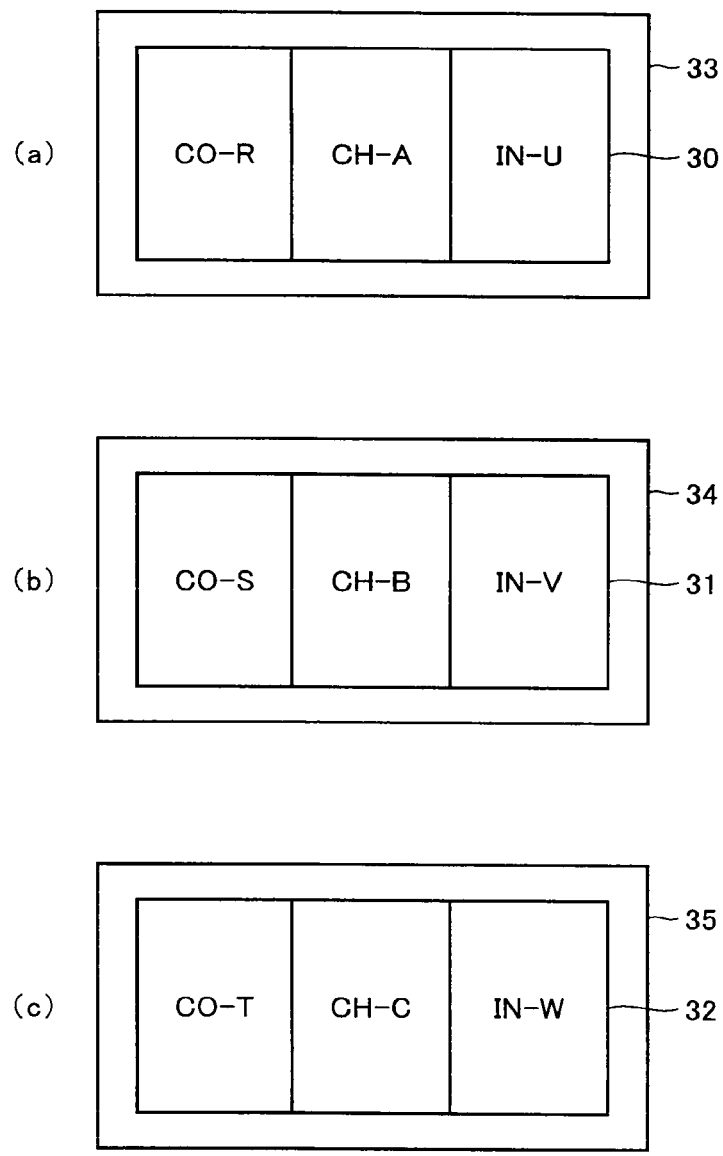
FIG. 12 shows a method for cooling power converting circuits shown in FIG. 11.

Further, as shown in FIG. 12 (a) to (c), power converting circuits 30 to 32 are fixed on coolers 33 to 35, respectively. Thermal energy generated in power converting circuits 30 to 32 is transmitted to coolers 33 to 35, respectively. Thermal energy of coolers 33 to 35 is dissipated into the air. This suppresses increase of the temperature of power converting circuits 30 to 32.

Further, in FIG. 12 (a), power converting circuit 30 has R-phase part CO-R, A-phase part CH-A and U-phase part IN-U, which are arranged on the surface of cooler 33 in sequence. R-phase part CO-R is a portion corresponding to the R-phase of a three-phase AC voltage from commercial AC power supply 7, and includes elements having R at the end of their reference signs in power converting circuit 30 of FIG. 11. A-phase part CH-A is a portion corresponding to the R-phase of power converting circuit 30, and includes elements having A at the end of their reference signs in power converting circuit 30 of FIG. 11. U-phase part IN-U is a portion corresponding to the U-phase of a three-phase AC voltage to be supplied to load 8, and includes elements having U at the end of their reference signs in power converting circuit 30 of FIG. 11.

Furthermore, in FIG. 12 (b), power converting circuit 31 has S-phase part CO-S, B-phase part CH-B and V-phase part IN-V, which are arranged on the surface of cooler 34 in sequence. S-phase part CO-S is a portion corresponding to the S-phase of the three-phase AC voltage from commercial AC power supply 7, and includes elements having S at the end of their reference signs in power converting circuit 31 of FIG. 11. B-phase part CH-B is a portion corresponding to the S-phase of power converting circuit 31, and includes elements having B at the end of their reference signs in power converting circuit 31 of FIG. 11. V-phase part IN-V is a portion corresponding to the V-phase of the three-phase AC voltage to be supplied to load 8, and includes elements having V at the end of their reference signs in power converting circuit 31 of FIG. 11.

Still further, in FIG. 12 (c), power converting circuit 32 has T-phase part CO-T, C-phase part CH-C and W-phase part IN-W, which are arranged on the surface of cooler 35 in sequence. T-phase part CO-T is a portion corresponding to the T-phase of the three-phase AC voltage from commercial AC power supply 7, and includes elements having T at the end of their reference signs in power converting circuit 32 of FIG. 11. C-phase part CH-C is a portion corresponding to the T-phase of power converting circuit 32, and includes elements having C at the end of their reference signs in power converting circuit 32 of FIG. 11. W-phase part IN-W is a portion corresponding to the W-phase of the three-phase AC voltage to be supplied to load 8, and includes elements having W at the end of their reference signs in power converting circuit 32 of FIG. 11.

Coolers 33 to 35 are two thirds of coolers 11 to 13 of FIG. 4 (a) to (b) in size, respectively. Further, each of power converting circuit 30 together with cooler 33, power converting circuit 31 together with cooler 34, and power converting circuit 32 together with cooler 35 makes up one unit.

In the second embodiment, the converter, the chopper and the inverter are integrated to make up three power converting circuits 30 to 32, and coolers 33 to 35 are provided for power converting circuits 30 to 32, respectively. Therefore, a smaller apparatus can be achieved.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

The invention claimed is:

1. An uninterruptible power supply apparatus, comprising:
   a combined converter/chopper circuit configured to convert a first AC power to DC power that is stored in a power storage device and to output the DC power stored in the power storage device during a power failure in which supply of the first AC power is stopped;
   an inverter to convert the DC power output by the combined converter/chopper circuit to a second AC power;
   a first cooler to cool said combined converter/chopper circuit; and
   a second cooler to cool said inverter;
   said combined converter/chopper circuit and said first cooler making up a single unit,
   said inverter and said second cooler making up a single unit,
   said first cooler including
      a first flat plate portion having a first surface on which said combined converter/chopper circuit is mounted, and
      a plurality of first fins provided on a second surface of said first flat plate portion,
   said second cooler including
      a second flat plate portion having a third surface on which said inverter is mounted, and
      a plurality of second fins provided on a fourth surface of said second flat plate portion,
   said first AC power being three-phase AC power,
   said combined converter/chopper circuit including three combined converter/chopper sub-circuits corresponding to three phases of said first AC power, respectively,
   each of said combined converter/chopper sub-circuits including a plurality of first switching elements connected in series between a first node and a second node and a plurality of first diodes connected in antiparallel to said plurality of first switching elements, respectively, a plurality of second switching elements connected in series between said first node and said second node and a plurality of second diodes connected in antiparallel to said plurality of second switching elements, respectively,
   wherein said first cooler and said second cooler are identical in cooling capacity.

2. The uninterruptible power supply apparatus according to claim 1, further comprising:
   a capacitor connected between said first node and said second node;
   a first fuse connected between a first DC voltage node and said first node; and
   a second fuse connected between a second DC voltage node and said second node,
   said capacitor, said first fuse and said second fuse are mounted on said first surface of said first flat plate portion.

* * * * *